US012672258B2

(12) United States Patent
Zhu et al.

(10) Patent No.: US 12,672,258 B2
(45) Date of Patent: Jun. 30, 2026

(54) LIQUID LEVEL HEIGHT DETECTION MECHANISM AND COMPUTING DEVICE

(71) Applicants: SQ TECHNOLOGY (SHANGHAI) CORPORATION, Shanghai (CN); INVENTEC CORPORATION, Taipei (TW)

(72) Inventors: Kangguang Zhu, Shanghai (CN); Hong-Chou Lin, Taipei (TW); Yu-Fan Chen, Taipei (TW)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 236 days.

(21) Appl. No.: 18/748,129

(22) Filed: Jun. 20, 2024

(65) Prior Publication Data

US 2025/0358958 A1     Nov. 20, 2025

(30) Foreign Application Priority Data

May 15, 2024    (CN) .......................... 202410607658.2

(51) Int. Cl.
*H05K 7/20* (2006.01)

(52) U.S. Cl.
CPC ................................ *H05K 7/20272* (2013.01)

(58) Field of Classification Search
CPC .... G06F 1/20; H05K 7/20272; H05K 7/1491; H05K 7/14; B23Q 11/1084; F28F 2265/16; F28F 9/26; G01L 7/063
See application file for complete search history.

(56) References Cited

U.S. PATENT DOCUMENTS

| | | | | | |
|---|---|---|---|---|---|
| 3,939,383 | A | * | 2/1976 | Alm ...................... | G01F 23/164 |
| | | | | | 361/178 |
| 7,905,096 | B1 | * | 3/2011 | Campbell .......... | H05K 7/20836 |
| | | | | | 62/93 |
| 2005/0126276 | A1 | * | 6/2005 | Chu ........................ | G01F 23/18 |
| | | | | | 73/149 |
| 2005/0126747 | A1 | * | 6/2005 | Chu ..................... | H05K 7/2079 |
| | | | | | 165/11.1 |
| 2008/0271527 | A1 | * | 11/2008 | Hewitt .................. | G01F 23/164 |
| | | | | | 73/299 |
| 2016/0346889 | A1 | * | 12/2016 | Gong ...................... | B05B 15/62 |
| 2017/0177041 | A1 | * | 6/2017 | Shelnutt ............. | H05K 7/20809 |
| 2017/0303442 | A1 | * | 10/2017 | Smith ................ | H05K 7/20318 |
| 2022/0390195 | A1 | * | 12/2022 | Gao ........................ | F28F 27/02 |
| 2025/0056753 | A1 | * | 2/2025 | Miao .................... | H05K 7/1491 |

* cited by examiner

*Primary Examiner* — Michael A Matey

(57) ABSTRACT

A liquid level height detection mechanism and a computing device are provided. The liquid level height detection mechanism includes a first mounting bracket and a first detection member mounted on the first mounting bracket, and the first detection assembly being configured to detect a first height of a liquid level of coolant; a second detection assembly comprising a second mounting bracket and a second detection member mounted on the second mounting bracket, and the second detection assembly being configured to detect a second height of the liquid level of the coolant; and a distance adjusting base, wherein the first mounting bracket and the second mounting bracket are both movably mounted on the distance adjusting base, and the first detection assembly is located higher than the second detection assembly.

10 Claims, 3 Drawing Sheets

LIQUID LEVEL HEIGHT DETECTION MECHANISM AND COMPUTING DEVICE

CROSS-REFERENCE TO RELATED APPLICATIONS

This application claims priority of Chinese Patent Application No. 2024106076582, filed on May 15, 2024, entitled "LIQUID LEVEL HEIGHT DETECTION MECHANISM AND COMPUTING DEVICE", the entire content of which is incorporated herein in its entirety.

TECHNICAL FIELD

The present disclosure relates to the technical field of computing devices, and in particular to a liquid level height detection mechanism and a computing device.

BACKGROUND

With the development of technologies such as the Internet of Things and 5G, the speed and scale of data generation continue to expand, and the need to process and analyze data in real time is becoming more and more urgent. In the era of new data centers, cloud computing and edge computing are cooperated to form a distributed computing system, which can effectively improve data processing speed and reduce network latency. As such, edge computing devices need to have higher computing power and lower power consumption to adapt to large-scale distributed deployment. Therefore, high-efficiency and energy-saving liquid cooling technology emerges, and gradually becomes a key way to solve the energy efficiency problem of new data centers.

Currently, it is a general trend to use full immersion liquid cooling. In a new immersion liquid cooling casing, it is necessary to ensure that a height of the coolant is not higher than a high height standard of a liquid level and not lower than a low height standard of the liquid level. However, the high height standard of the liquid level and the low height standard of the liquid level need to be tested repeatedly during a test stage. During testing, a position of a detection assembly needs to be changed constantly. The traditional detection assembly is usually fixedly mounted, which is not suitable for changing the position frequently and affects the detection efficiency. Therefore, a liquid level height detection mechanism has the defects of complicated test and low efficiency.

SUMMARY

According to various embodiments, a liquid level height detection mechanism and a computing device are provided.

According to a first aspect, a liquid level height detection mechanism is provided. The liquid level height detection mechanism includes a first detection assembly including a first mounting bracket and a first detection member mounted on the first mounting bracket, and the first detection assembly being configured to detect a first height of a liquid level of coolant; a second detection assembly including a second mounting bracket and a second detection member mounted on the second mounting bracket, and the second detection assembly being configured to detect a second height of the liquid level of the coolant; and a distance adjusting base, wherein the first mounting bracket and the second mounting bracket are both movably mounted on the distance adjusting base, and the first detection assembly is located higher than the second detection assembly.

In one of the embodiments, the first detection member includes a first liquid level sensor, a first mounting portion, and a first transmission line, the first liquid level sensor is connected to the first mounting portion, and the first transmission line is electrically connected to the first liquid level sensor and is configured to transmit detection data from the first liquid level sensor; the first mounting bracket includes a first mounting plate provided with a first mounting hole, and the first mounting portion is received in the first mounting hole; the second detection member includes a second liquid level sensor, a second mounting portion, and a second transmission line, the second liquid level sensor is connected to the second mounting portion, and the second transmission line is electrically connected to the second liquid level sensor and is configured to transmit detection data from the second liquid level sensor; the second mounting bracket includes a second mounting plate provided with a second mounting hole, and the second mounting portion is received in the second mounting hole.

In one of the embodiments, a side wall of the first mounting portion is provided with a first external thread, a hole wall of the first mounting hole is provided with a first internal thread, the first external thread and the first internal thread are engaged with each other, a side wall of the second mounting portion is provided with a second external thread, a hole wall of the second mounting hole is provided with a second internal thread, and the second external thread and the second internal thread are engaged with each other.

In one of the embodiments, the first detection assembly further includes a first fixture provided in the first mounting hole, the first mounting portion is connected to the first fixture, the second detection assembly further includes a second fixture provided in the second mounting hole, and the second mounting portion is connected to the second fixture.

In one of the embodiments, the first mounting bracket further includes a third mounting plate and a first fastener, the third mounting plate is connected to the first mounting plate and is provided with a first adjusting hole, the distance adjusting base includes a first connecting base, the first fastener is connected to the first connecting base through the first adjusting hole, the second mounting bracket includes a fourth mounting plate and a second fastener, the fourth mounting plate is connected to the second mounting plate and is provided with a second adjusting hole, the distance adjusting base includes with a second connecting base, and the second fastener is connected to the second connecting base through the second adjusting hole.

In one of the embodiments, the first adjusting hole and the second adjusting hole are both oblong holes, and axes of the first adjusting hole and the second adjusting hole are arranged vertically.

In one of the embodiments, the third mounting plate is further provided with a first guiding hole, the fourth mounting plate is further provided with a second guiding hole, the distance adjusting base is further provided with a first guiding post and a second guiding post, the first guiding post is movably provided in the first guiding hole, and the second guiding post is movably provided in the second guiding hole.

In one of the embodiments, the first mounting bracket is located higher than the second mounting bracket, and an orthogonal projection of the first mounting bracket on a horizontal plane and an orthogonal projection of the second mounting bracket on the horizontal plane are staggered.

In one of the embodiments, the distance adjusting base is provided with a first scale on one side of the first detection assembly, and the distance adjusting base is further provided with a second scale on one side of the second detection assembly.

According to a second aspect, a computing device is further provided. The computing device includes a casing, an adapter plate, a motherboard, and the aforementioned liquid level height detection mechanism. The adapter plate, the motherboard, and the liquid level height detection mechanism are received in the casing, the casing is filled with coolant, the liquid level height detection mechanism is configured to detect a liquid level height value of the coolant in the casing, the liquid level height detection mechanism is electrically connected to the adapter plate, the adapter plate is provided on the motherboard, and the motherboard includes a baseboard management controller configured to acquire a detection signal of the liquid level height detection mechanism.

According to the aforementioned liquid level height detection mechanism and the computing device, the first detection assembly and the second detection assembly are provided on the distance adjusting base, the first detection assembly is located higher than that of the second detection assembly, the first detection member is configured to detect the first height of the liquid level of coolant, the second detection member is configured to detect the second height of the liquid level of the coolant, and the first detection assembly and the second detection assembly are both movably mounted on the distance adjusting base. When testing a high height standard of the liquid level and a low height standard of the liquid level, height positions of the first detection assembly and the second detection assembly can be conveniently adjusted to satisfy the requirements of different application scenarios. The test is convenient and efficient.

The details of one or more embodiments of the present disclosure are set forth in the accompanying drawings and the description below. Other features, objects and advantages of the present disclosure will become apparent from the description, the accompanying drawings, and the claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DESCRIPTION OF REFERENCE SIGNS

Figure 1:
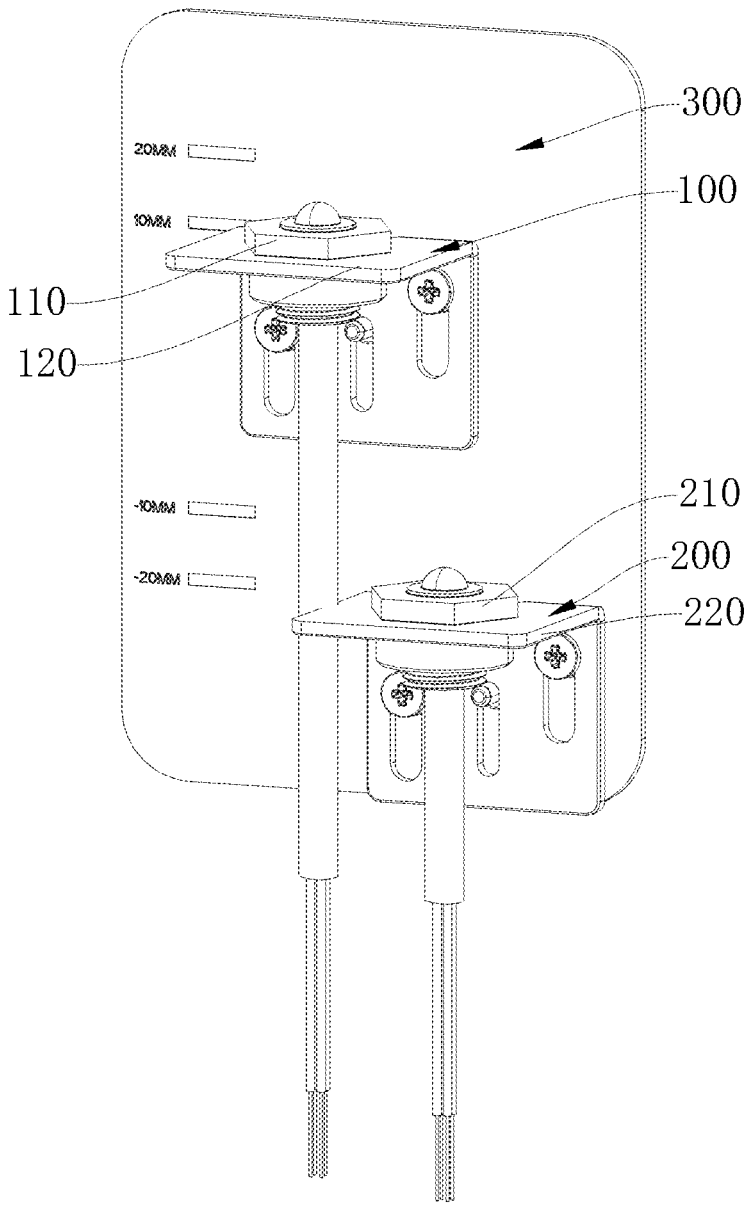
FIG. 1 is a perspective view of a liquid level height detection mechanism according to an embodiment of the present disclosure.

10. Casing; 20. Liquid level height detection mechanism; 30. Adapter plate; 40. Motherboard;
100. First detection assembly; 110. First detection member; 111. First liquid level sensor; 112. First installation part; 113. First transmission line; 120. First mounting bracket; 121. First mounting plate; 121A. First mounting hole; 122. Third mounting plate; 122A. First adjusting hole; 122B. First guiding hole; 123. First fastener;
200. Second detection assembly; 210. Second detection member; 211. Second liquid level sensor; 212. Second mounting portion; 213. Second transmission line; 220. Second mounting bracket; 221. Second mounting plate; 221A. Second mounting hole; 222. Fourth mounting plate; 222A. Second adjusting hole; 222B. Second guiding hole; 223. Second fastener;
300. Distance adjusting base; 310. First connecting base; 320. Second connecting base; 330. First guiding post; 340. Second guiding post; 350. First scale; 360. Second scale.

DETAILED DESCRIPTION OF THE EMBODIMENTS

In order to make the above objects, features and advantages of the present disclosure clear and easier to understand, the specific embodiments of the present disclosure are described in detail below in combination with the accompanying drawings. Many specific details are set forth in the following description to facilitate a full understanding of the present disclosure. However, the present disclosure can be implemented in many ways different from those described herein, and those skilled in the art can make similar improvements without departing from the connotation of the present disclosure. Therefore, the present disclosure is not limited by the specific embodiments disclosed below.

In the description of the present disclosure, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential direction" are based on the azimuth or position relationship shown in the attached drawings, which are only for the convenience of describing the present disclosure and simplifying the description, rather than indicating or implying that the device or element must have a specific azimuth, be constructed and operated in a specific azimuth, so such terms cannot be understood as a limitation of the present disclosure.

In addition, the terms "first" and "second" are only used for descriptive purposes and cannot be understood as indicating or implying relative importance or implicitly indicating the number of indicated technical features. Thus, the features defined with "first" and "second" may explicitly or implicitly include at least one of the features. In the description of the present disclosure, "a plurality of" means at least two, such as two, three, etc., unless otherwise expressly and specifically defined.

In the present disclosure, unless otherwise expressly specified and limited, the terms "mount", "connect", "contact", "fix" and other terms should be understood in a broad sense, for example, they can be fixed connections, detachable connections, or integrated. They can be mechanical connection or electrical connection. They can be directly connected or indirectly connected through an intermediate medium. They can be the connection within two elements or the interaction relationship between two elements, unless otherwise expressly limited. For those skilled in the art, the specific meaning of the above terms in the present disclosure can be understood according to the specific situation.

In the present disclosure, unless otherwise expressly specified and limited, the first feature "above" or "below" the second feature may be in direct contact with the first and second features, or the first and second features may be in indirect contact through an intermediate medium. Moreover, the first feature is "above" the second feature, but the first feature is directly above or diagonally above the second feature, or it only means that the horizontal height of the first feature is higher than the second feature. The first feature is "below" of the second feature, which can mean that the first feature is directly below or obliquely below the second feature, or simply that the horizontal height of the first feature is less than that of the second feature.

It should be noted that when an element is called "fixed to" or "provided on" another element, it can be directly on another element or there can be a centered element. When an element is considered to be "connected" to another element, it can be directly connected to another element or there may be intermediate elements at the same time. The terms "vertical", "horizontal", "up", "down", "left", "right" and similar expressions used herein are for the purpose of illustration only and do not represent the only embodiment.

There is coolant in a computing equipment with full immersion liquid cooling, and a liquid level standard of coolant is not a constant value, but will vary according to factors such as a specific equipment design, a cooling system capacity, and a coolant type. In general, a liquid level of coolant should be kept within a safe range provided by a cooling system to ensure effective heat exchange and heat dissipation. The liquid level that is too low may result in poor cooling, while the liquid level that is too high may cause leaks or other safety issues. An embodiment of the present disclosure provides a liquid level height detection mechanism, which can detect whether a height of the liquid level of the coolant in the computing device exceeds a range of a maximum threshold and a minimum threshold.

Referring to FIG. 1, the liquid level height detection mechanism includes a first detection assembly 100, a second detection assembly 200, and a distance adjusting base 300. The first detection assembly 100 includes a first detection member 110 and a first mounting bracket 120. The first detection member 110 is mounted on the first mounting bracket 120 and is configured to detect a first height of a liquid level of coolant. The second detection assembly 200 includes a second detection member 210 and a second mounting bracket 220. The second detection member 210 is mounted on the second mounting bracket 220 and is configured to detect a second height of the liquid level of the coolant. The first height is greater than the second height. Both the first mounting bracket 120 and the second mounting bracket 220 are movably mounted on the distance adjusting base 300, and the first detection assembly 100 is located higher than the second detection assembly 200.

According to the aforementioned liquid level height detection mechanism, the first detection assembly 100 and the second detection assembly 200 are provided on the distance adjusting base 300, and the first detection assembly 100 is located higher than the second detection assembly 200. The first detection assembly 100 is movably mounted on the distance adjusting base 300 through the first mounting bracket 120, and the second detection assembly 200 is also movably mounted on the distance adjusting base 300 through the second mounting bracket 220. The overall structure of the liquid level height detection mechanism is simple. When testing the first height of the liquid level and the second height of the liquid level, height positions of the first detection assembly 100 and the second detection assembly 200 can be conveniently adjusted to satisfy the requirements of different application scenarios. The test is convenient and efficient.

Figure 2:
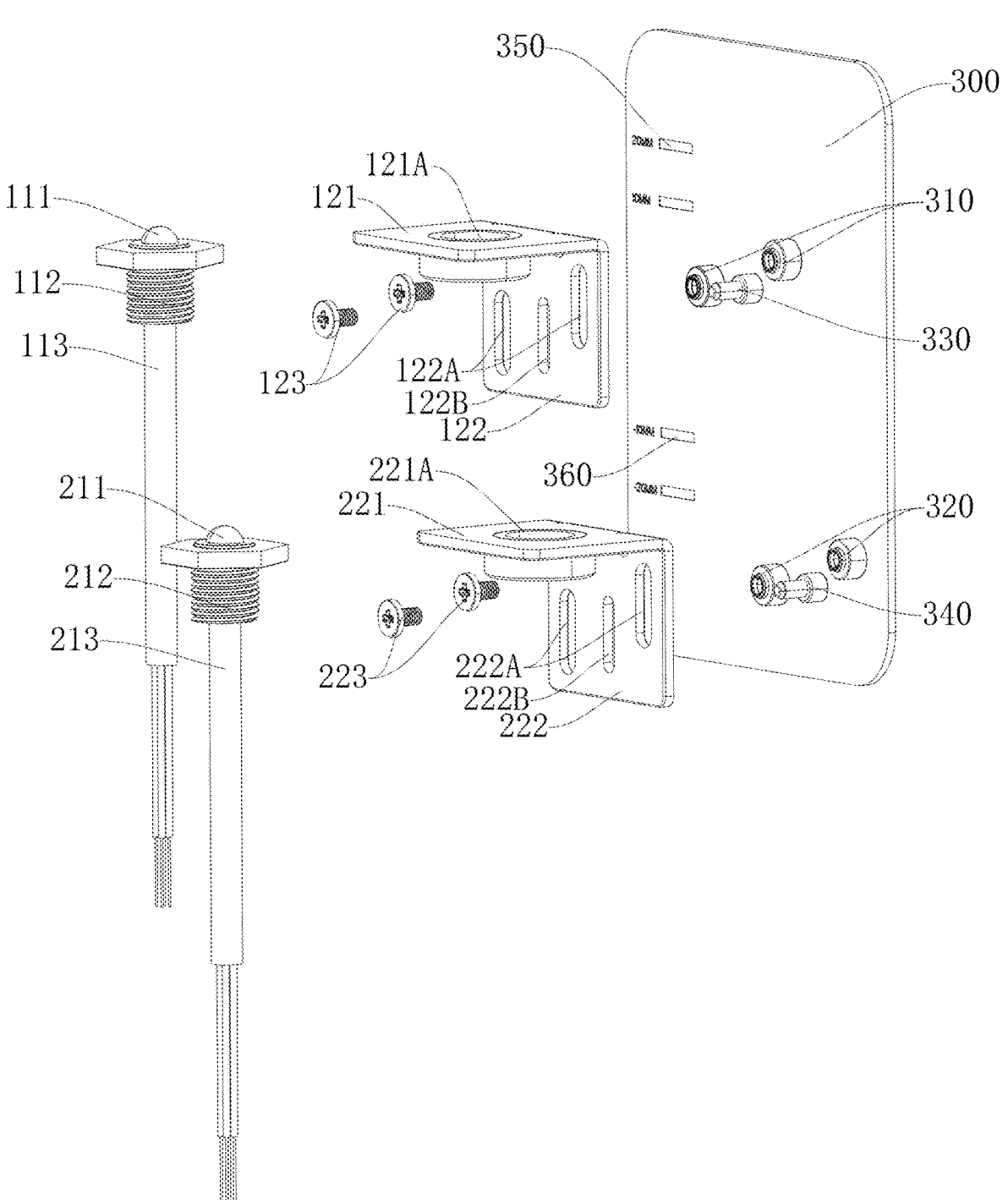
FIG. 2 is an exploded view of the liquid level height detection mechanism of FIG. 1.

Referring to FIG. 2, in some embodiments, the first detection member 110 includes a first liquid level sensor 111, a first mounting portion 112, and a first transmission line 113. The first liquid level sensor 111 is connected to the first mounting portion 112. The first transmission line 113 is electrically connected to the first liquid level sensor 111 and is configured to transmit detection data from the first liquid level sensor 111. The first mounting bracket 120 includes a first mounting plate 121 provided with a first mounting hole 121A. The first mounting portion 112 is received in the first mounting hole 121A. Specifically, the first mounting portion 112 is a hollow cylinder, the first liquid level sensor 111 is connected to an end of the first mounting portion 112, and the first transmission line 113 is connected to the first liquid level sensor 111 through the first mounting portion 112. According to one embodiment, the first liquid level sensor 111 is connected to the first mounting portion 112, so that the first liquid level sensor 111 can be conveniently received in the first mounting hole 121A of the first mounting bracket 120 through the first mounting portion 112. The first liquid level sensor 111 can detect the first height of the liquid level and transmit the first height of the liquid level through the first transmission line 113, so as to acquire the first height of the liquid level in a test stage or a normal use stage, and the first detection member 110 is easy to be assembled.

Further, referring to FIG. 2, the second detection member 210 includes a second liquid level sensor 211, a second mounting portion 212, and a second transmission line 213. The second liquid level sensor 211 is connected to the second mounting portion 212. The second transmission line 213 is electrically connected to the second liquid level sensor 211 and is configured to transmit detection data from the second liquid level sensor 211. The second mounting bracket 220 includes a second mounting plate 221 provided with a second mounting hole 221A. The second mounting portion 212 is received in the second mounting hole 221A. Specifically, the second mounting portion 212 is a hollow cylinder, the second liquid level sensor 211 is connected to an end of the second mounting portion 212, and the second transmission line 213 is connected to the second liquid level sensor 211 through the second mounting portion 212. According to one embodiment, the second liquid level sensor 211 is connected to the second mounting portion 212, so that the second liquid level sensor 211 can be conveniently received in the second mounting hole 221A of the second mounting bracket 220 through the second mounting portion 212. The second liquid level sensor 211 can detect the second height of the liquid level and transmit the second height of the liquid level through the second transmission line 213, so as to acquire the second height of the liquid level in the test stage or the normal use stage, and the second detection member 210 is easy to be assembled.

In an embodiment, referring to FIG. 2, a side wall of the first mounting portion 112 is provided with a first external thread, a hole wall of the first mounting hole 121A is provided with a first internal thread, and the first external thread and the first internal thread are engaged with each other, that is, the first mounting portion 112 and the first mounting bracket 120 are threadedly connected. Further, a side wall of the second mounting portion 212 is provided with a second external thread, a hole wall of the second mounting hole 221A is provided with a second internal thread, and the second external thread and the second internal thread are engaged with each other, that is, the second mounting portion 212 and the second mounting bracket 220 are threadedly connected. The first mounting portion 112 and the first mounting bracket 120 are threadedly connected, and the second mounting portion 212 and the second mounting bracket 220 are threadedly connected, the first mounting portion 112 can be firmly connected to the first mounting bracket 120, and the second mounting portion 212 can be firmly connected to the second mounting bracket 220, so that the connection between the components is more stable.

In other embodiments, the first detection assembly 100 further includes a first fixture provided in the first mounting hole 121A, and the first mounting portion 112 is connected to the first fixture. The second detection assembly 200 further includes a second fixture provided in the second mounting hole 221A, and the second mounting portion 212 is connected to the second fixture. The first fixture and the second fixture may be three-jaw chucks that are provided in the first mounting hole 121A and the second mounting hole 221A, so that the first mounting portion 112 and the second mounting portion can be clamped by three movable jaws of each three-jaw chuck, thereby achieving fast and accurate mounting. Therefore, the first mounting portion 112 and the second mounting portion 212 can be quickly connected by the first fixture and the second fixture, thereby reducing the difficulty of mounting and improving the efficiency of mounting.

In an embodiment, referring to FIG. 2, the first mounting bracket 120 further includes a third mounting plate 122 and a first fastener 123. The third mounting plate 122 is connected to the first mounting plate 121 and is provided with a first adjusting hole 122A. The distance adjusting base 300 includes a first connecting base 310. The first fastener 123 is connected to the first connecting base 310 through the first adjusting hole 122A. Further, the second mounting bracket 220 further includes a fourth mounting plate 222 and a second fastener 223. The fourth mounting plate 222 is connected to the second mounting plate 221 and is provided with a second adjusting hole 222A. The distance adjusting base 300 further includes a second connecting base 320. The second fastener 223 is connected to the second connecting base 320 through the second adjusting hole 222A. The first mounting bracket 120 is fixed to the first connecting base 310 through the first fastener 123, so that the first detection assembly 100 can be connected to the distance adjusting base 300. The second mounting bracket 220 is fixed to the second connecting base 320 through the second fastener 223, so that the second detection assembly 200 can be connected to the distance adjusting base 300. The overall connection structure of the liquid level height detection mechanism is easy to operate, the assembly difficulty is reduced, and the work efficiency is improved.

In this embodiment, the number of the first adjusting hole 122A and the number of the second adjusting hole 222A are both two, so that the connection between the first mounting bracket 120 and the distance adjusting base 300 and the connection between the second mounting bracket 220 and the distance adjusting base 300 are more stable. The first fastener 123 and the second fastener 223 are screws or bolts, the first connecting base 310 and the second connecting base 320 are provided with threaded counterbores, and the screws or bolts can be provided tightly in the threaded counterbores, which has a simple structure and ensures the stability of the connection between the first fastener 123 and the first connecting base 310 and the connection between the second fastener 223 and the second connecting base 320.

Specifically, referring to FIG. 1 and FIG. 2, the first adjusting hole 122A and the second adjusting hole 222A are both oblong holes, and axes of the first adjusting hole 122A and the second adjusting hole 222A are arranged vertically.

The heights of the first detection assembly 100 and the second detection assembly 200 need to be repeatedly adjusted during test. The first adjusting hole 122A and the second adjusting hole 222A are configured to be oblong holes, and the oblong holes are arranged along the vertical direction, after the first fastener 123 and the second fastener 223 are loosened, the first mounting bracket 120 and the second mounting bracket 220 can be adjusted up and down, which is simple to operate during repeated test and improves test efficiency.

In an embodiment, referring to FIG. 1 and FIG. 2, the third mounting plate 122 is further provided with a first guiding hole 122B. The fourth mounting plate 222 is further provided with a second guiding hole 222B. The distance adjusting base 300 is further provided with a first guiding post 330 and a second guiding post 340. The first guiding post 330 is movably provided in the first guiding hole 122B. The second guiding post 340 is movably provided in the second guiding hole 222B. The first guiding hole 122B is movably provided in the first guiding post 330, and the second guiding hole 222B is movably provided in the second guiding post 340, so that sliding ranges of the first mounting bracket 120 and the second mounting bracket 220 are limited, and the operation efficiency of height adjustment of the first mounting bracket 120 and the second mounting bracket 220 is improved.

In an embodiment, referring to FIG. 1 and FIG. 2, the distance adjusting base 300 is provided with a first scale 350 on one side of the first detection assembly 100, and the distance adjusting base 300 is provided with a second scale 360 on one side of the second detection assembly 200. Since different heights of the first detection assembly 100 and the second detection assembly 200 need to be repeatedly adjusted in the test stage, by respectively arranging the first scale 350 and the second scale 360 on one side of the first detection assembly 100 and one side of the second detection assembly 200, the first detection assembly 100 and the second detection assembly 200 can be adjusted by referring to the first scale 350 and the second scale 360 when adjusting the height, which makes the adjustment process more intuitive and improves the adjustment efficiency.

In an embodiment, as shown in FIG. 1, the first mounting bracket 120 is located higher than the second mounting bracket 220, and an orthogonal projection of the first mounting bracket 120 on a horizontal plane and an orthogonal projection of the second mounting bracket 220 on the horizontal plane are staggered. By staggering the first detection assembly 100 and the second detection assembly 200 horizontally and vertically respectively, the first detection assembly 100 and the second detection assembly 200 can detect the first height of the liquid level and the second height of the liquid level at different heights respectively, and the first detection assembly 100 and the second detection assembly 200 are horizontally staggered to avoid interference between the first transmission line 113 and the second transmission line 213.

Figure 3:
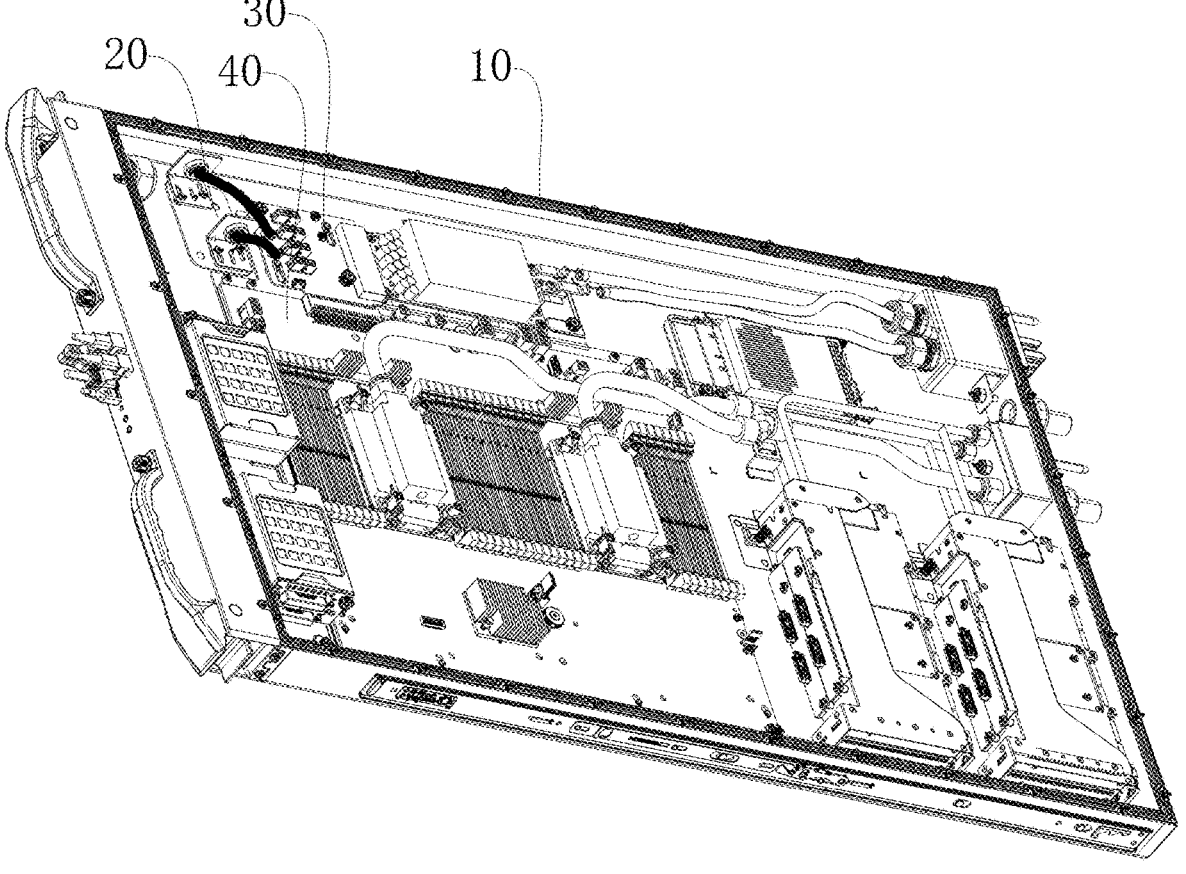
FIG. 3 is a perspective view of a computing device according to an embodiment of the present disclosure.

In one embodiment, referring to FIG. 3, a computing device is further provided, which includes a casing 10, the liquid level height detection mechanism 20 according to any one of the above embodiments, an adapter plate 30, and a motherboard 40. The adapter plate 30, the motherboard 40, and the liquid level height detection mechanism 20 are received in the casing 10. The casing 10 is filled with coolant. The liquid level height detection mechanism 20 is configured to detect a liquid level height value of the coolant in the casing 10. The liquid level height detection mechanism 20 is electrically connected to the adapter plate 30, the adapter plate 30 is provided on the motherboard 40. The motherboard 40 includes a baseboard management controller (BMC) configured to acquire a detection signal of the liquid level height detection mechanism 20.

Specifically, in this embodiment, the baseboard management controller will always read liquid level height values from the liquid level height detection mechanism 20 and outputs the liquid level height values to a terminal. The baseboard management controller reads the liquid level height values once per second. Moreover, the baseboard management controller compares the liquid level height values with preset ranges, respectively. If the liquid level height value exceeds the preset range, a warning sign will be displayed on a display of the terminal to warn a staff to check and improve the security of the computing device.

The liquid level height detection mechanism 20 is electrically connected to the adapter plate 30, and liquid level height values measured by the liquid level height detection mechanism 20 is transmitted to the adapter plate 30, and then the adapter plate 30 transmits the liquid level height value to the baseboard management controller for processing. According to one embodiment, the liquid level height detection mechanism 20 is received in the casing 10, and the liquid level height detection mechanism 20 has a simple overall structure and can be used to detect the first height of the liquid level of the coolant and the second height of the liquid level of the coolant. In addition, when testing the maximum threshold of the liquid level and the minimum threshold of the liquid level, the height positions of the first detection assembly 100 and the second detection assembly 200 can be conveniently adjusted to satisfy the requirements of different application scenarios. The test is convenient and efficient.

The Aforementioned Liquid Level Height Detection Mechanism has the Following Beneficial Effects:

1. The first detection assembly 100 is movably connected to the distance adjusting base 300 through the first mounting bracket 120, and the second detection assembly 200 is also movably connected to the distance adjusting base 300 through the second mounting bracket 220. The overall structure of the liquid level height detection mechanism is simple. When testing a high height standard of the liquid level and a low height standard of the liquid level, height positions of the first detection assembly 100 and the second detection assembly 200 can be conveniently adjusted to satisfy the requirements of different application scenarios. The test is convenient and efficient.

2. The first adjusting hole 122A and the second adjusting hole 222A are oblong holes, and the oblong holes are arranged along the vertical direction, after the first fastener 123 and the second fastener 223 are loosened, the first mounting bracket 120 and the second mounting bracket 220 can be adjusted up and down, which is simple to operate during repeated test and improves test efficiency.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A liquid level height detection mechanism, comprising:
   a first detection assembly comprising a first mounting bracket and a first detection member mounted on the first mounting bracket, and the first detection assembly being configured to detect a first height of a liquid level of coolant;
   a second detection assembly comprising a second mounting bracket and a second detection member mounted on the second mounting bracket, and the second detection assembly being configured to detect a second height of the liquid level of the coolant; and
   a distance adjusting base, wherein the first mounting bracket and the second mounting bracket are both movably mounted on the distance adjusting base, and the first detection assembly is located higher than the second detection assembly.

2. The liquid level height detection mechanism according to claim 1, wherein the first detection member comprises a first liquid level sensor, a first mounting portion, and a first transmission line, the first liquid level sensor is connected to the first mounting portion, and the first transmission line is electrically connected to the first liquid level sensor and is configured to transmit detection data from the first liquid level sensor;
   the first mounting bracket comprises a first mounting plate provided with a first mounting hole, and the first mounting portion is received in the first mounting hole;
   the second detection member comprises a second liquid level sensor, a second mounting portion, and a second transmission line, the second liquid level sensor is connected to the second mounting portion, and the second transmission line is electrically connected to the second liquid level sensor and is configured to transmit detection data from the second liquid level sensor;
   the second mounting bracket comprises a second mounting plate provided with a second mounting hole, and the second mounting portion is received in the second mounting hole.

3. The liquid level height detection mechanism according to claim 2, wherein a side wall of the first mounting portion is provided with a first external thread, a hole wall of the first mounting hole is provided with a first internal thread, the first external thread and the first internal thread are engaged with each other, a side wall of the second mounting portion is provided with a second external thread, a hole wall of the second mounting hole is provided with a second internal thread, and the second external thread and the second internal thread are engaged with each other.

4. The liquid level height detection mechanism according to claim 2, wherein the first detection assembly further comprises a first fixture provided in the first mounting hole, the first mounting portion is connected to the first fixture, the second detection assembly further comprises a second fixture provided in the second mounting hole, and the second mounting portion is connected to the second fixture.

5. The liquid level height detection mechanism according to claim 2, wherein the first mounting bracket further comprises a third mounting plate and a first fastener, the third mounting plate is connected to the first mounting plate and is provided with a first adjusting hole, the distance adjusting base comprises a first connecting base, the first fastener is connected to the first connecting base through the first adjusting hole, the second mounting bracket comprises a fourth mounting plate and a second fastener, the fourth mounting plate is connected to the second mounting plate and is provided with a second adjusting hole, the distance adjusting base comprises with a second connecting base, and the second fastener is connected to the second connecting base through the second adjusting hole.

6. The liquid level height detection mechanism according to claim 5, wherein the first adjusting hole and the second adjusting hole are both oblong holes, and axes of the first adjusting hole and the second adjusting hole are arranged vertically.

7. The liquid level height detection mechanism according to claim 5, wherein the third mounting plate is further provided with a first guiding hole, the fourth mounting plate is further provided with a second guiding hole, the distance adjusting base is further provided with a first guiding post and a second guiding post, the first guiding post is movably provided in the first guiding hole, and the second guiding post is movably provided in the second guiding hole.

8. The liquid level height detection mechanism according to claim 1, wherein the first mounting bracket is located higher than the second mounting bracket, and an orthogonal projection of the first mounting bracket on a horizontal plane and an orthogonal projection of the second mounting bracket on the horizontal plane are staggered.

9. The liquid level height detection mechanism according to claim 1, wherein the distance adjusting base is provided with a first scale on one side of the first detection assembly, and the distance adjusting base is further provided with a second scale on one side of the second detection assembly.

10. A computing device, comprising a casing, an adapter plate, a motherboard, and the liquid level height detection mechanism according to claim 1, wherein the adapter plate, the motherboard, and the liquid level height detection mechanism are received in the casing, the casing is filled with coolant, the liquid level height detection mechanism is configured to detect a liquid level height value of the coolant in the casing, the liquid level height detection mechanism is electrically connected to the adapter plate, the adapter plate is provided on the motherboard, and the motherboard comprises a baseboard management controller configured to acquire a detection signal of the liquid level height detection mechanism.

\* \* \* \* \*